United States Patent [19]

Joo et al.

[11] Patent Number: 5,594,762
[45] Date of Patent: Jan. 14, 1997

[54] APPARATUS FOR RETIMING DIGITAL DATA TRANSMITTED AT A HIGH SPEED

[75] Inventors: Bheom S. Joo; Bhum C. Lee; Jung S. Kim; Seok Y. Kang, all of Daejeon, Rep. of Korea

[73] Assignee: Electronics and Telecommunications Research Institute, Rep. of Korea

[21] Appl. No.: 354,417

[22] Filed: Dec. 12, 1994

[30] Foreign Application Priority Data

Dec. 11, 1993 [KR] Rep. of Korea ............... 1993 27360

[51] Int. Cl.⁶ ..................... H04L 7/00; H03K 5/135
[52] U.S. Cl. ..................... 375/371; 327/161
[58] Field of Search ..................... 327/161, 162, 327/163, 165, 166; 375/354, 371

[56] References Cited

U.S. PATENT DOCUMENTS

| | | | |
|---|---|---|---|
| 4,385,395 | 5/1983 | Tanaka et al. | 375/359 |
| 4,400,667 | 8/1983 | Belkin | 331/1 A |
| 4,422,176 | 12/1983 | Summers | 375/376 |
| 4,535,459 | 8/1985 | Hogge, Jr. | 375/324 |
| 4,672,639 | 6/1987 | Tanabe et al. | 375/371 |
| 4,814,879 | 3/1989 | McNeely | 348/537 |
| 5,036,529 | 7/1991 | Shin | 375/374 |
| 5,101,419 | 3/1992 | Lowe et al. | 375/354 |
| 5,280,539 | 1/1994 | Yeom et al. | 375/354 |
| 5,359,630 | 10/1994 | Wade et al. | 375/354 |

FOREIGN PATENT DOCUMENTS

| | | | |
|---|---|---|---|
| 4142825 | 7/1992 | Germany | 327/162 |
| 143017 | 7/1985 | Japan | 327/161 |
| 5-68025 | 3/1993 | Japan | 375/354 |

OTHER PUBLICATIONS

"An ECL gate array with integrated PLL–based clock recovery and synthesis for high speed data and telecom applications", by David S. Rosky, Bruce H. Coy, and Marc Friedman, *SPIE*, vol. 1577, 1991, pp. 182–191.

Primary Examiner—Stephen Chin
Assistant Examiner—Jeffrey W. Gluck
Attorney, Agent, or Firm—Merchant, Gould, Smith, Edell, Welter & Schmidt

[57] ABSTRACT

This invention relates to an apparatus for retiming digital data transmitted at a high speed even though the phase of a binary data bit is not related to the phase of the static offset of a retiming clock pulse, the apparatus comprising: local clock pulse generation means 11 for generating and outputting local clock pulse FT; delayed clock pulse parallel generation means 12 for outputting, in parallel, n delayed clock pulses delayed sequentially by one cycle of local clock pulse FT; input data transition detection means 13 for outputting pulse DT each time the rising and falling carrier waves intersect in input data D; sequential logic parallel phase detection means 14 for providing clock pulse selection data by outputting sequential logic phases of the upper location of the pulse generated during input data transition and transition location of n delayed clock pulses; retiming clock pulse selection means 15 for outputting a retiming clock pulse according to the clock pulse selection data of the input delayed clock pulses; time delay compensation means 16 for outputting delayed input data; and data retiming means 17 for outputting the data retimed DR according to the retiming clock pulse.

4 Claims, 6 Drawing Sheets

APPARATUS FOR RETIMING DIGITAL DATA TRANSMITTED AT A HIGH SPEED

BACKGROUND OF THE INVENTION

1. Field of Invention

The present invention relates to an apparatus for retiming digital data transmitted at a high speed, and more particularly, to an apparatus for retiming it stably, even though the phase of binary data bits is not related to that of static offset of the retiming clock pulses and there are wander and alignment jitter in the input binary data.

2. Description of the Prior Art

Conventional data retiming devices were designed to provide retiming clock pulses, which have a rising edge in the center of the eye pattern or in the interval of data bits transmitted to retiming parts of the transmission side and the receiving side from the source clock generation part, as shown in FIGS. 1A and 1B. The timing of data transmitted in parallel or in serial is predictable at the retiming part of the receiving side due to the relatively slow speed of the data bits. However, it is more difficult to predict phases between receiving data and clock pulse at the retiming part of the receiving side when the interval of data bits is reduced due to the increased speed of data bits. Accordingly, a conventional device for retiming data transmitted at a high speed can not meet the hold time and the setup time of a D-type flip-flop, and metastability occurs. Metastability is also generated due to environmental factors, even though the transmission distance is relatively short and the size of alignment jitter is small. These matters make stable retiming impossible.

To solve the above problems, a variety of methods using the concept of bit synchronization of transmission have been provided, in which the transmission side transmits only data and the receiving side generates retiming clock pulses from the received data through a non-linear process or performs data retiming by generating retiming clock pulses with a voltage control oscillator. Representative references are C. P. Summers (U.S. Pat. No. 4,422,176), M. Belkin (U.S. Pat. No. 4,400,667), and C. R. Hogge (U.S. Pat. No. 4,535,459). In addition, an application retiming device (AMCC 20P025, retiming chip Applied by Micro Corp.) was invented. However, these methods have a bit synchronization device with a complicated structure. While the devises perform stable data retiming for transmitting data at a high speed, they are too complex and non-economical to use for a data link which is transmitted in parallel because integration is difficult due to use of analog parts, such as a voltage control oscillator and a low pass filter.

Additionally, digital bit synchronization devices perform received data retiming by using a clock pulse with a cycle of $\frac{1}{16}$ times data unit bit interval transmitted, such as M. Tanaka (U.S. Pat. No. 4,385,395). Tanaka has the advantage of not using an analog low-pass filter, but has the disadvantage of not being suitable for performing data retiming at a high speed, since that requires a more stable clock pulse than the data bits at the high speed.

On the other hand, Kwan (U.S. Pat. No. 5,036,529) discloses a retiming device which adapts received data to the retiming clock pulse by delaying the data with active delay elements. This device has the advantage of performing a relatively stable retiming function by using a clock pulse with the same period as the data unit bit interval, but the device can not perform stable retiming functions when the static offset phase between the data and the clock pulse reaches the limitation of the delay element alignment jitter.

SUMMARY OF THE INVENTION

An object of the present invention is to solve the above-mentioned problems encountered in the prior art and, thus, provide an apparatus for retiming digital data in a high speed transmission, capable of achieving suitable retiming clock pulses. The apparatus eliminates generation of metastability by transmission or by environmental factors, and also eliminates alignment jitter generated in the transmitted data using a digital logic element when the transmission distance is relatively short and an exterior retiming clock pulse has the same period as the unit bit interval of the transmission data and has an arbitrary static offset phase with the data.

In accordance with the present invention, the above and other objects can be accomplished by provision of an apparatus for retiming digital data comprising local clock pulse generation means for generating and outputting local clock pulse; delayed clock pulse parallel generation means for delaying an external clock pulse by a period of the local clock pulse from the local clock pulse generation means and outputting the n (n is natural number greater than or equal to 4) delayed clock pulses in parallel; input data transition detection means for outputting a pulse DT that is shorter than the unit interval of input data and longer than the minimum allowable clock pulse width of a D-type flip-flop belonging to each component whenever the alternating rising and falling edges of the data carrier pulse intersect the external input data D; sequential logic parallel phase detection means for providing n−1 clock pulse selection data signals by logically outputting the phase relation between the transition point of an input data signal from the input data transition detection means and the transition point of n delayed clock pulses input from the delayed clock pulse parallel generation means; retiming clock pulse selection means for outputting a retiming clock pulse by getting the input of the n−1 delayed clock pulses from the delayed clock pulse parallel generation means and by selecting the delayed clock pulses which have the nearest falling portion relative to the transition timing edge of input data signal D according to the clock pulse selection data signals from the sequential logic parallel phase detection means; time delay compensation means for outputting a time compensated signal after compensating the input data signal D by a time delay due to the selecting process of the retiming clock pulse in the retiming clock pulse selection means; and data retiming means for outputting retimed data signals after performing the retiming for the time compensated signals from the time delay compensation means according to the retiming clock pulse input from the retiming clock pulse selection means.

BRIEF DESCRIPTION OF THE DRAWINGS

Other objects and aspects of the invention will become apparent from the following description of embodiments with reference to the accompanying drawings in which:

FIG., 1A is a block diagram of a conventional data retiming device;

FIG. 5B is a timing diagram of signals in the principal parts of the input data transition detection part in accordance with the present invention;

DETAILED DESCRIPTION OF THE PREFERRED EMBODIMENTS

Figure 1A:
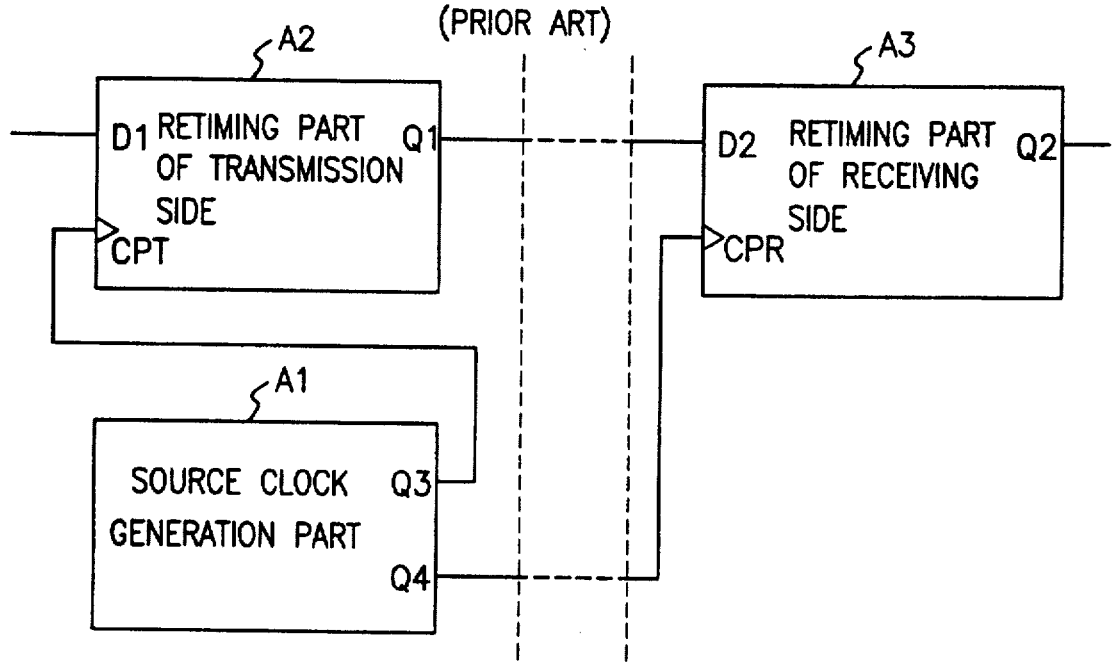
FIG. 1B is a timing diagram of signals in the principal parts of the conventional data retiming device.
Figure 1B:
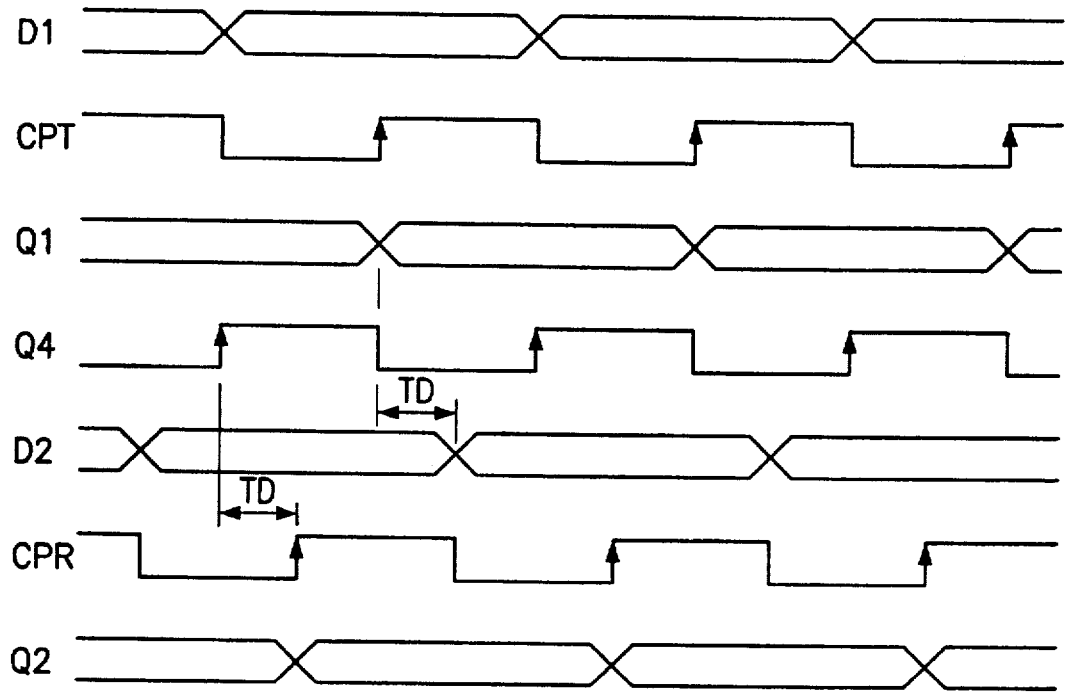
Figure 2:
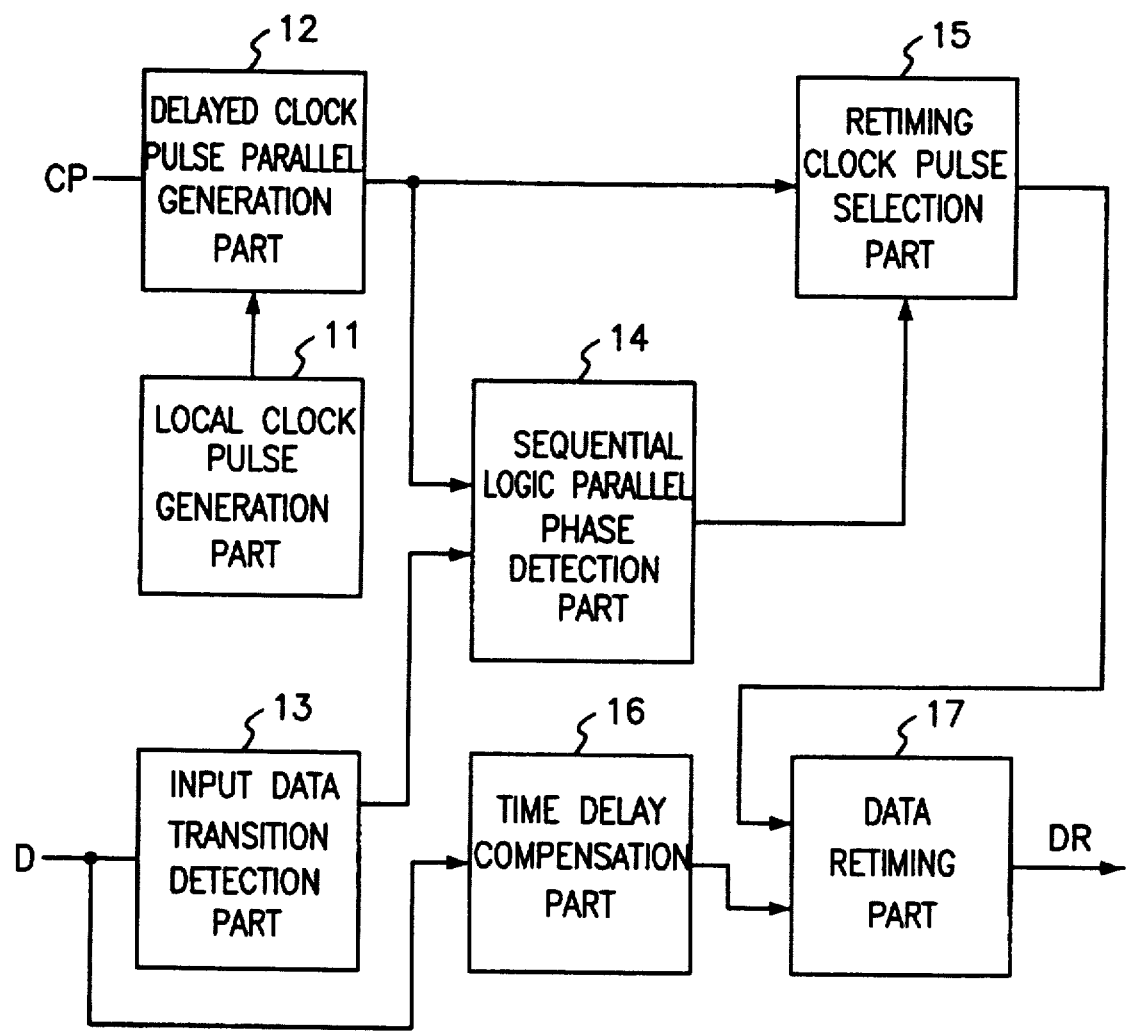
FIG. 2 is a block diagram of a digital data retiming device in accordance with the present invention.

FIG. 2 is a block diagram of a data retiming device in accordance with the present invention. As shown in FIG. 2, a local clock pulse generation part 1t generates a clock pulse whose frequency is more than four times the speed of binary data bit input from outside and whose period is longer than the total sum of the setup time and hold time of any of the flip-flops 31, 32, 33, ..., 3(n–1), 3n (see FIG. 3) and sends it to a delayed clock pulse parallel generation part 12 described below. Such a local clock pulse generation part 11 may be formed by a ring oscillator (not shown) or other suitable means.

The delayed clock pulse parallel generation part 12 delays the clock pulse input CP from outside by one period of the local clock pulse generated in the local clock pulse generation part 11, and outputs n delayed clock pulses (n being a natural number greater than or equal to 4) where the total delay time becomes longer than one period of the clock pulse input CP from outside, to a sequential logic parallel phase detection part 14 and a retiming clock pulse selection part 15 described below.

An input data transition detection part 13 generates a pulse whenever alternating rising and falling portions of external binary input data signal D are sensed, which pulse being shorter than the input data unit bit interval but longer than or equal to the minimum allowable clock pulse width of a flip-flop 31, 32, 33, ..., 3(n–1), 3n and is synchronized with the input data transition and outputted to a sequential logic parallel phase detection part 14 described below.

The sequential logic parallel phase detection part 14 outputs clock pulse selection data signals with a logic phase relation between the rising portion of the pulse generated during the transition of input data received from the input data transition detection part 13 and the transition point of n delayed clock pulses received from the delayed clock pulse parallel generation part 12, and outputs the clock pulse selection data signals to a retiming clock pulse selection part 15, described below.

The retiming clock pulse selection part 15 receives n–1 delayed clock pulses from the delayed clock pulse parallel generation part 12 and selection data about the n–1 delayed clock pulses from the sequential logic parallel phase detection part 14. Thereafter, it selects the delayed clock pulse whose difference of input data transition point and delayed clock pulse transition point is within one period of the local clock pulse and whose falling portion is generated at the closest point to a transition timing point of the input data among the n–1 delayed clock pulses, and outputs it to a data retiming part 17, described below.

The time delay compensation part 16 receives external binary data input and it outputs delayed data to data retiming part 17. This output delayed data has been compensated by the time delay in the process of the retiming clock pulse selection in the retiming clock pulse selection part 15.

The data retiming part 17 receives the retiming clock pulse from the retiming clock pulse selection part 15 and performs retiming of the time compensated data received from the time delay compensation part 16 and then outputs the retimed data.

Figure 3A:
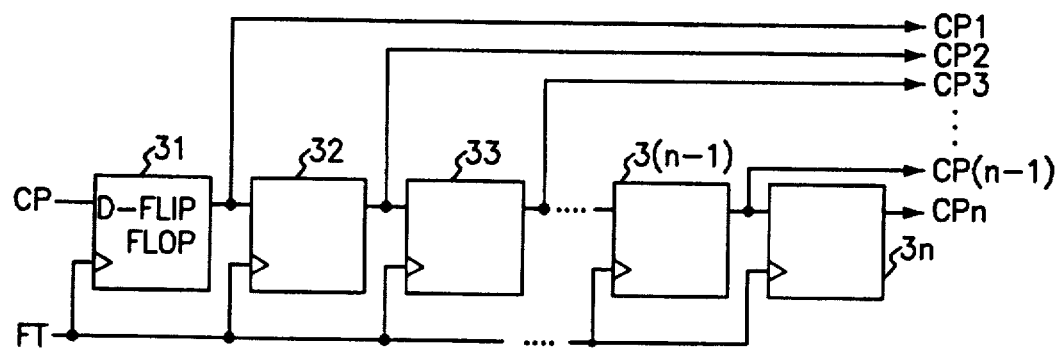
FIG. 3A is a detailed circuit diagram of the delayed clock pulse parallel generation part in accordance with the present invention.

FIG. 3A shows a circuit diagram of the delayed clock pulse parallel generation part 12 in accordance with the present invention. As shown in FIG. 3A, in the delayed clock pulse parallel generation part 12, D-type flip-flops 31, 32, and 33, 3(n–1), 3n generate n clock pulses CP1, CP2, CP3, ..., CP(n–1) CPn which are clock pulse CP delayed sequentially by 1 period, 2 periods, 3 periods, ..., (n–1) periods, n periods of FT by the local clock pulse FT generated in the local clock pulse generation part 11 in FIG. 2. This occurs if the external clock pulse CP period is the same as the unit bit interval of the binary data transmitted from outside and the external clock pulse CP has an arbitrary static offset phase with the data. Here, n refers to a natural number greater than or equal to 4 which meets the requirement of n x one period of FT (TFT)>one period of CP (TCP). The n clock pulses CP1, CP2, CP3, ..., CP(n–1), CPn and the n–1 clock pulses CP1, CP2, CP3, ..., CP(n–1) are output to the sequential logic parallel phase detection part 14 and the retiming clock pulse selection part 15 of FIG. 2, respectively.

Figure 3B:
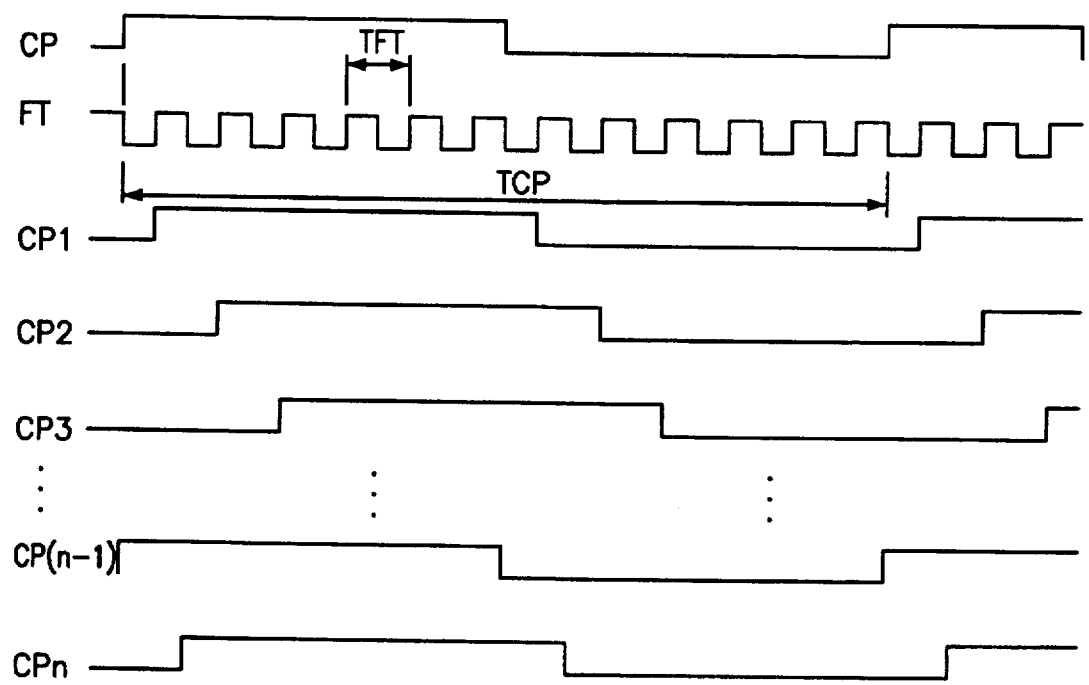
FIG. 3B is a timing diagram of signals in the principal parts of the delayed clock pulse parallel generation part in accordance with the present invention.

FIG. 3B shows the timing diagram of signals for the principal parts of the delayed clock pulse parallel generation part 12. It indicates that n clock pulses are generated whose phase difference is one period interval of the local clock pulse FT during the minimum period longer than the TCP (one period of cp).

Figure 4A:
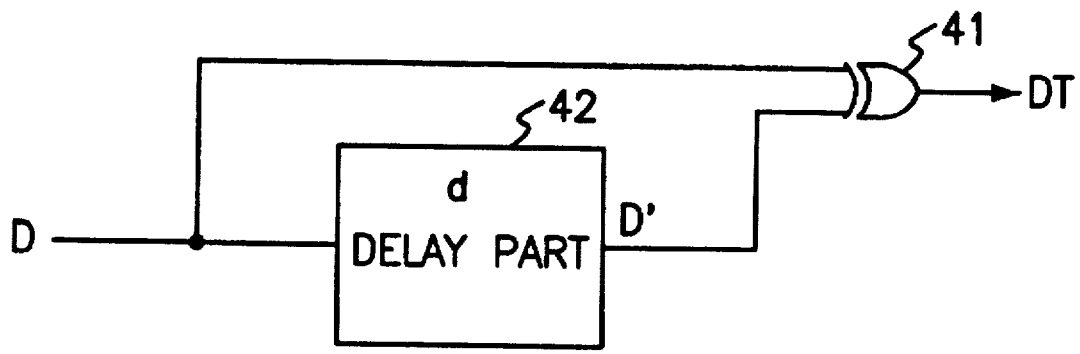
FIG. 4A is a detailed block diagram of the input data transition detection part in accordance with the present invention.

FIG. 4A shows a detailed block diagram of the input data transition detection part 13 in accordance with the present invention.

As shown in FIG. 4A, the delay part d consists of logic element gates, which delays binary data D input from outside and then outputs them to an input terminal of exclusive OR gate 41.

After this process, exclusive OR gate 41 performs exclusive OR of the delayed data D' through the delay part D2 with external binary input data D. It then outputs the pulse DT longer than or equal to the minimum allowable clock pulse width to the sequential logic parallel phase detection part 14, as shown in FIG. 2, when rising and falling edges are generated in the binary data D input from the outside.

Figure 4B:
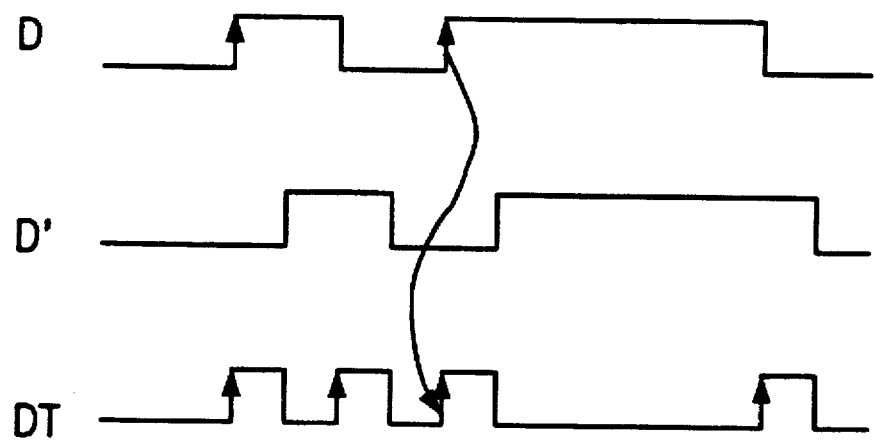

FIG. 4B shows a timing diagram of signals in the principal parts of the input data transition detection part in accordance with the present invention. It includes binary data D which is input from the outside, delayed data D', and the signal between the pulses DT generated during data transition. Phase difference between the data transition point and the rising edge of DT shall be designed to the minimum.

Figure 5:
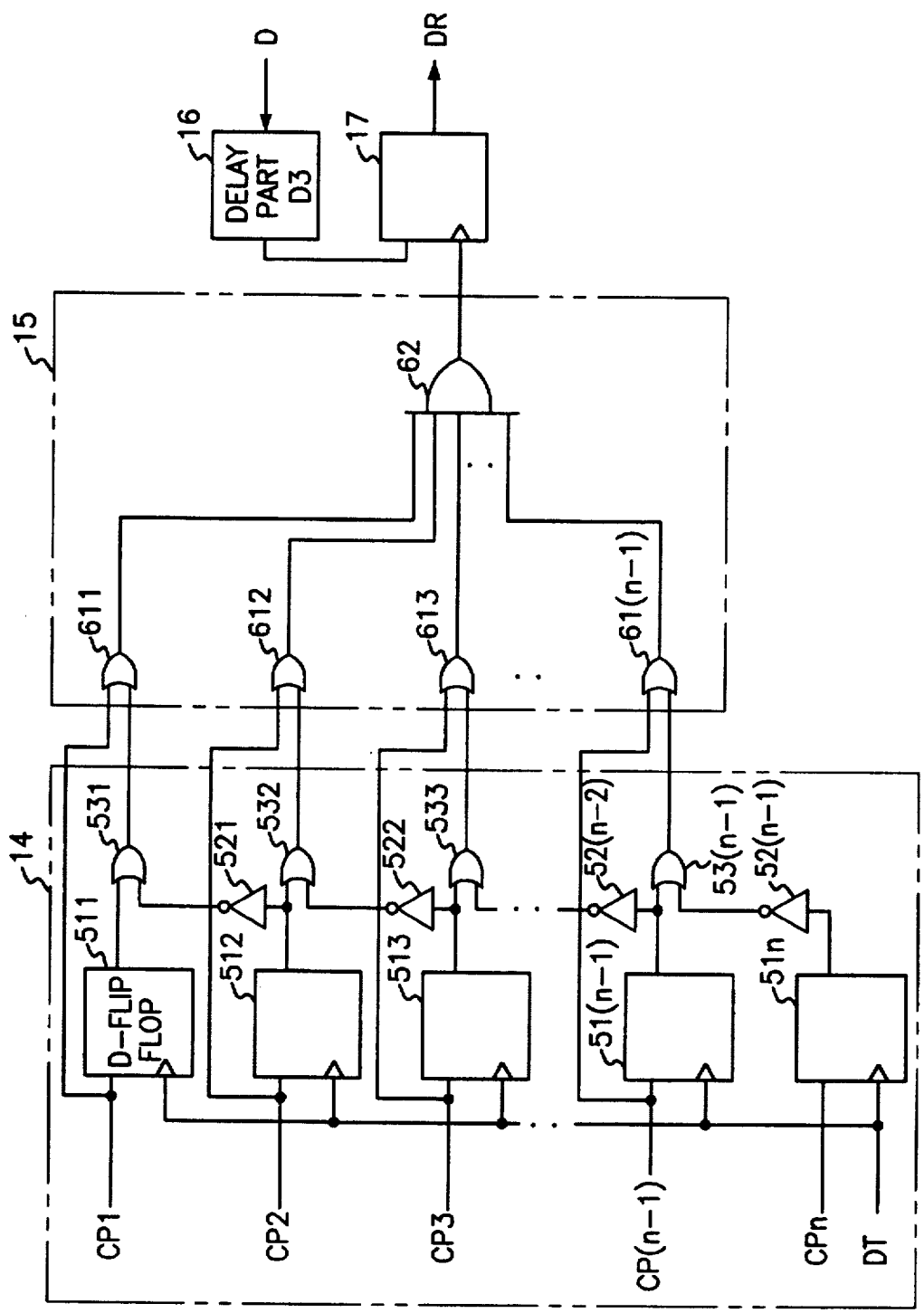
FIG. 5 is a detailed circuit diagram of the sequential logic parallel phase detection part, the retiming clock pulse selection part, the time delay compensation part, and the data retiming part.

FIG. 5 shows a detailed circuit diagram of the sequential logic parallel phase detection part 14, the retiming clock pulse selection part 15, the time delay compensation part 16, and the data retiming part 17.

In sequential logic parallel phase detection part 14, n D-type flip-flops 511, 512, 513, ..., 51(n–1), 51n each receives input of n delayed clock pulses CP1, CP2, CP3, . . . , CP(n−1), CPn which are output from the delayed clock pulse parallel generation part 12 through corresponding data input terminal, and pulse DT which is output from the input data transition detection part 13 through the corresponding clock pulse input terminal. Then, the sequential logic parallel phase detection part 14 outputs the phase value of n clock pulses CP1, CP2, CP3, . . . , CP(n−1), CPn at DT's rising edge in the form of logic level. The n−1 inverters 521, 522, . . . , 52(n−1) invert each output of the n−1 D-type flip-flops 512, 513, . . . , 51(n−1), 551n.

The 'i'th (i is a number from 1 to n−1) OR gate 53i of n−1 OR gates 531, 532, 533, . . . , 53(n−1) performs OR of the output of the inverter 52i, which inverted D-type flip-flop 51(i+1) showing the phase of the CP(i+1) (clock pulse delayed by the (i+1) period by the local clock pulse FT) with logic value, and the output of the D-type flip-flop 51i showing the phase of CPi (clock pulse delayed by i by the local clock pulse FT) in logic value at the timing point of transition generation in the input data (rising edge of DT). Then the OR gate outputs the result to the retiming clock pulse selection part 15.

Since the output of 'i'th OR gate 53i is the resulting OR of the output of the 'i'th D-type flip-flop 51i and the inverted ouput of the '(i+1)'th D-type flip-flop 51(i+1), then the output of the 'i'th OR gate 53i becomes logic level "0" when the output of the 'i'th D-type flip-flop 51i is logic level "0" and the output of the '(i+1)'th D-type flip-flop 51(i+1) is logic level "1" at the same time. This indicates that the falling edge took place for CPi right before the. rising edge (input data transition point intersection generation) in DT pulse and the falling edge took place for CP(i+1) right after the rising edge occurring in DT pulse.

That is, CPi or CP(i+1) is a clock pulse having the largest timing margin in retiming the input data D which generates the falling edge closest to the transition point in the input data.

The retiming clock pulse selection part 15 performs AND of the selected clock pulses in AND gate 62, which has an n−1 input terminal, after selecting more than or as many as 1 among the n−1 delayed clock pulses and outputs them to the data retiming part 17. In other words, it performs OR of n−1 delayed clock pulse CP1, CP2, CP3, . . . , CP(n−1) outputs from the delayed clock pulse parallel generation part 12 and clock pulse selection data output from n−1 OR gates 531, 532, 533, . . . , 53(n−1) of the sequential logic parallel phase detection part 14 through n−1 OR gates 611, 612, 613, . . . , 61(n−1). That is, the 'i'th OR gate 61i outputs the clock pulse CPi output from the delayed clock pulse parallel generation part 12 when the output of the 'i'th OR gate 53i of the sequential logic parallel phase detection part 14 is logic level "0", or in other words, only when the falling edge of the CPi (clock pulse delayed by i period by the local clock pulse FT) is right before the data transition point and the falling edge of CP(i+1) is right after the data transition point.

Figure 6:
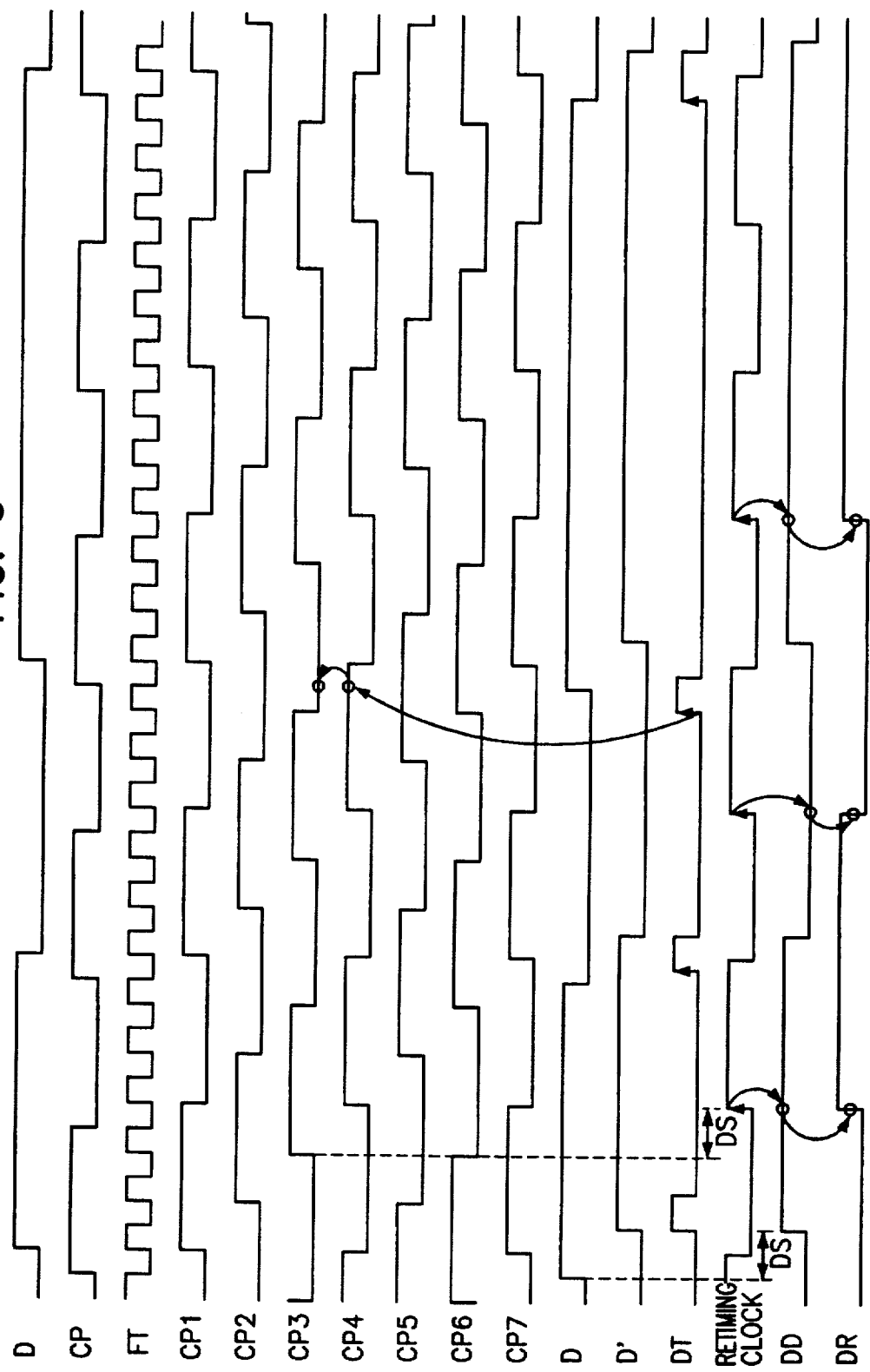
FIG. 6 is a timing diagram of signals in the principal part in accordance with the present invention.

Since 'n' in the delayed clock pulse generation part 12 was selected from natural numbers greater than or equal to 4, which meets the requirement of n×TFT (one period of local clock pulse) > TCP (one period of input clock pulse from outside), at least one out of the n−1 OR gates 611, 612, 613, . . . , 61(n−1) of the retiming clock pulse selection part 15 shall output the clock pulse which rises in the center of the input data eye pattern, as shown in FIG. 6.

Time delay compensation part 16 delays the external binary data D input by a transmission delay time DS in OR gate 61i of the retiming clock pulse selection part 15 and AND gate 62 which has an n−1 input terminal through the delay part D3 consisting of logic element gates, and outputs the time delay compensated data DD to the data retiming part 17.

Data retiming part 17 receives input of the time delay compensated data DD from the time delay compensation part 16 through the data input terminal and the retiming clock pulse ouput from the retiming clock pulse selection part 15 through the clock pulse input terminal, and then outputs the data after retiming them.

FIG. 6 shows a timing diagram of signals in the principal part of a preferred embodiment in accordance with the present invention. As shown in FIG. 6, the local clock pulse FT generated from the local clock pulse generation part 11 has a frequency which is 6 times the bit speed of binary data input. The delayed clock pulse parallel generation part 12 delays the external clock pulse CP, which is input from outside sequentially by the interval of one period of the local clock pulse FT, to generate 7 delayed clock pulses CP1, CP2, CP3, CP4, CP5, CP6, CP7. It shows that the retiming clock pulse in the data retiming part 16 retimes data in the center of the data eye pattern if the delay time of the retiming clock pulse in the retiming clock pulse selection process is equal to that of the data DD time delay compensated in the time delay compensation part 16.

The present invention has the following advantages:

First, the present invention can be integrated into a semiconductor since only the local clock pulse, whose frequency is greater than or equal to four times the retiming clock pulse, is required.

Second, the present invention can apply to a data retiming device with a wide range of bit speed by making the total delay time of n delayed clock pulses sufficiently long.

Third, the present invention can eliminate jitter and wander.

Fourth, the present invention provides stable operation against environmental change and can be applied to implementation of high speed bit synchronization of more advanced semiconductor integration in the future.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for retiming digital data transmitted at a high speed, the apparatus comprising:

local clock pulse generation means for generating and outputting a local clock pulse;

delayed clock pulse parallel generation means for delaying an external clock pulse CP by a period independent of the local clock pulse from said local clock pulse generation means and outputting n delayed clock pulses in parallel, n being a natural number greater than or equal to 4, said delayed clock pulse parallel generation means including a plurality of flip-flops, each of said flip-flops having a minimum allowable clock pulse width;

input data transition detection means for receiving an external input data signal D having a unit bit interval with rising and falling portions and for outputting a pulse DT whenever the rising and falling portions are sensed in the external input data signal D, the pulse DT being shorter than the unit bit interval of the external data signal D and longer than the minimum allowable clock pulse width of the flip-flops;

sequential logic parallel phase detection means for providing (n−1) clock pulse selection data signals with a logic phase relation between a first transition point of input data signal DT from said input data transition detection means and a second transition point of n delayed clock pulses input from said delayed clock pulse parallel generation means;

retiming clock pulse selection means for outputting a retiming clock pulse by getting input of n−1 delayed clock pulses from said delayed clock pulse generation means and by selecting the delayed clock pulse having a nearest falling portion relative to the first transition point of input data signal DT according to the clock pulse selection data signals from said sequential logic parallel phase detection means;

time delay compensation means for outputting a compensated signal after compensating the input data signal D by a time delay due to retiming clock pulse selection in said retiming clock pulse selection means;

data retiming means for outputting retimed data signals after performing retiming for time compensated signals from said time delay compensation means according to retiming clock pulse input from said retiming clock pulse selection means.

2. An apparatus according to claim 1, wherein said local clock pulse generation means generates a first frequency more than four times a second frequency of input data signal D, and outputs the local clock pulse having period longer than the total sum of setup time and hold time of one of said flip-flops.

3. An apparatus according to claim 1 wherein said delayed clock pulse parallel generation means comprises n D-type flipflops, so as to meet the requirement of n times one period of the local clock pulse being greater than one period of the clock pulse CP, and outputs clock pulses CP1, CP2, CP3, . . . , CP(n−1), CPn to said sequential logic parallel phase detection means and n−1 clock pulses CP1, CP2, . . . , CP(n−1) to said retiming clock pulse selection means.

4. An apparatus according to claim 1 wherein said retiming clock pulse selection means compares the phase of a clock pulse $CP_i$, which is CP delayed by i periods of the local clock pulse output, i being an arbitrary number between 1 and n−1, from said delayed clock pulse parallel generation means with that of clock pulse selection data signals from said sequential logic parallel phase detection means, and then, after selecting at least one clock pulse having a falling portion nearest the first transition point, performs the logic function AND on the selected at least one clock pulse and outputs a resulting signal to said data retiming means.

* * * * *

UNITED STATES PATENT AND TRADEMARK OFFICE
CERTIFICATE OF CORRECTION

PATENT NO. : 5,594,762

DATED : Jan. 14, 1997

INVENTOR(S) : Joo, et al.

It is certified that error appears in the above-identified patent and that said Letters Patent is hereby corrected as shown below:

Column 2, Line 23 "(n is natural" should read --(n is a tural--.

Column 3, Line 7 "5B" should read --4B--.

Column 3, Line 23 "1t" should read --11-- (number 11).

Column 4, Line 39 "cp)" should read --CP)--.

Signed and Sealed this

Seventh Day of October, 1997

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,594,762

DATED : 14 Jan 1997

INVENTOR(S) : Joo, et al.

It is certified that error appears in the above-identified patent and that said Letters Patent is hereby corrected as shown below:

In 73 [Assignee] add --Korea Telecommunication Authority, Seoul, Republic of Korea--.

Signed and Sealed this

Seventh Day of April, 1998

Attest:

BRUCE LEHMAN

*Attesting Officer*  *Commissioner of Patents and Trademarks*